United States Patent [19]

Rogers et al.

[11] 3,982,144

[45] Sept. 21, 1976

[54] DIRECTIONAL LOW-FREQUENCY RING HYDROPHONE

[75] Inventors: Peter H. Rogers, Reston; Joseph F. Zalesak, Alexandria, both of Va.

[73] Assignee: The United States of America as represented by the Secretary of the Navy, Washington, D.C.

[22] Filed: Aug. 23, 1974

[21] Appl. No.: 500,206

[52] U.S. Cl. .................................. 310/9.6; 310/9.8; 310/9.5; 340/10

[51] Int. Cl.$^{2}$ .................................. H01L 41/04

[58] Field of Search ............... 310/9.6, 9.5, 9.7, 9.8, 310/8.7, 8.2; 340/10

[56] References Cited

UNITED STATES PATENTS

| | | | |
|---|---|---|---|
| 2,961,635 | 11/1960 | Trott | 310/8.7 X |
| 3,043,967 | 7/1962 | Clearwaters | 310/9.6 X |
| 3,068,446 | 12/1962 | Ehrlich et al. | 310/9.6 X |
| 3,177,382 | 4/1965 | Green | 310/9.6 X |
| 3,211,931 | 10/1965 | Tehon | 310/9.1 X |
| 3,845,333 | 10/1974 | Holloway | 310/9.6 X |

*Primary Examiner*—Mark O. Budd
*Attorney, Agent, or Firm*—R. S. Sciascia; Philip Schneider; Melvin L. Crane

[57] ABSTRACT

A small low frequency acoustic receiver which is formed into a cylinder or ring by use of a plurality of separate elements of piezoelectric material. Each element is secured with its sides in face-to-face relationship with an electrode between each joined face in contact with each adjacent element. The electrodes are alternately connected into an electrical circuitry for transmitting electrical signals to a receiver.

Other construction techniques may be used to assemble separate elements in a cylindrical arrangement. Over a band of very low frequencies, the cylinder or ring has a high sensitivity (i.e., it produces a large electrical signal) to sound incident in the axial direction compared with its sensitivity in the radial direction. Over this band of very low frequencies the sensitivity of the cylinder or ring is relatively constant for sound incident in the axial direction. This band of very low frequencies is much lower in frequency than any mechanical or acoustical axisymmetric resonance of the cylinder or ring.

6 Claims, 7 Drawing Figures

EXAMPLE OF LOW FREQUENCY INVERTED PATTERN
OF A CIRCUMFERENTIALLY DRIVEN RING (f = 474 Hz)

FREE-FIELD VOLTAGE SENSITIVITY

CIRCUMFERENTIAL POLARIZATION

EXAMPLE OF PAINTED ON ELECTRODES TO PRODUCE CIRCUMFERENTIAL POLARIZATION

DIRECTIONAL LOW-FREQUENCY RING HYDROPHONE

BACKGROUND OF THE INVENTION

This invention relates to directional low frequency ring hydrophones and more particularly to small size circumferentially polarized ring hydrophones operable at extremely low frequencies which are well below any axisymmetric mechanical resonances of the ring, such as ring hydrophone having a high sensitivity to sound incident in the axial direction compared with the sensitivity to sound incident in the radial direction over a band of very low frequencies.

Heretofore rings made of a plurality of stave sections have been set forth operable at low frequencies near the resonance for the ring in water. Such devices have been set forth in U.S. Pat. Nos. 3,177,382 and 3,543,059. Each of these patents refer to operation at very low frequencies. However, it is clear that their intended operating region is near the resonant frequency. Furthermore, the primary purpose of these patents is to produce a high power, low frequency source. In carrying out the teaching of the prior art, there is set forth that large diameter rings of 80 inches are required for operation at a frequency of 500 Hz. Such rings were formed of a plurality of individual segments secured together edge-to-edge with an electrical conductor between the surfaces. In order to decrease the diameter of the unit with low frequency operation, the staves have been fluted so that the ratio of mean diameter to thickness is increased so the natural frequency of resonance of the cylinder with a water load is correspondingly decreased. It is noted that in this configuration, the device operates at the natural frequency of resonance with a water load. Even upon forming the cylinder with a plurality of staves, the diameter is still rather large as set forth in the patents listed above. Furthermore, according to the current state of the art regarding the use of such rings, the axial direction is always assumed to be a direction of relatively low response with the maximum response in the radial direction.

SUMMARY OF THE INVENTION

This invention makes use of a plurality of piezoceramic material elements secured together face-to-face in a ring or cylinder with electrodes applied to their joined faces. Alternating electrodes are connected in parallel in an electrical circuit with adjacent electrodes oppositely charged and the assembled ring is circumferentially polarized. The finished ring, for example, is 8 ⅛ inches outside diameter 6 15/16 inches inside diameter, and 4 ¾inches high and made with 32 barium titanate segments secured together by a suitable epoxy with the electrodes therein contacting adjacent faces. The device operates as a directional receiver at extremely low frequencies, i.e., frequencies well below any axisymmetric mechanical resonances of the ring; that is, the mechanical resonant frequency corresponding to an axisymmetric vibration mode. In any plane perpendicular to the axis of the cylinder all axisymmetrical points or points with equiradial distances in the plane of the ring structure have the same resonant response. It has been determined that such circumferentially polarized rings have a maximum dimension which is small compared to wavelength with a high axial sensitivity compared with the radial sensitivity over a band of very low frequencies. The region of operation for the ring set forth above is from 200 Hz to 800 Hz. In this region, the axial sensitivity is relatively constant and the radial sensitivity is significantly reduced. The reason for the suppression of the radial sensitivity, compared with the axial sensitivity, is that the monopole contribution cancels the higher order contributions in the radial direction.

Since the monopole moment for free flooded rings is small, this cancellation occurs at low frequencies when the higher moments also become small. The relative signs of the volume velocity (giving rise to the monopole radiation) and the mean radial velocity are favorable for cancellation of the radiation in the radial direction over a band of very low frequencies only for free-flooded rings which are circumferentially polarized.

The device has no dipole moment and is thus insensitive to acceleration and locally generated noise. For a ring, the configuration is unique in that there exists a band of frequencies for which the acoustic wavelength is much larger than any ring dimension for which the radial sensitivity is significantly reduced compared with axial sensitivity. The teaching of the state of the art is that the low frequency sensitivity of a ring is always greater in the radial direction than in the axial direction. The ring may be enclosed in a rubber boot with castor oil within the boot filling the voids, or the surface of the ring may be coated with a protective coating which electrically insulates the ring and electrodes.

DETAILED DESCRIPTION

Figure 1:
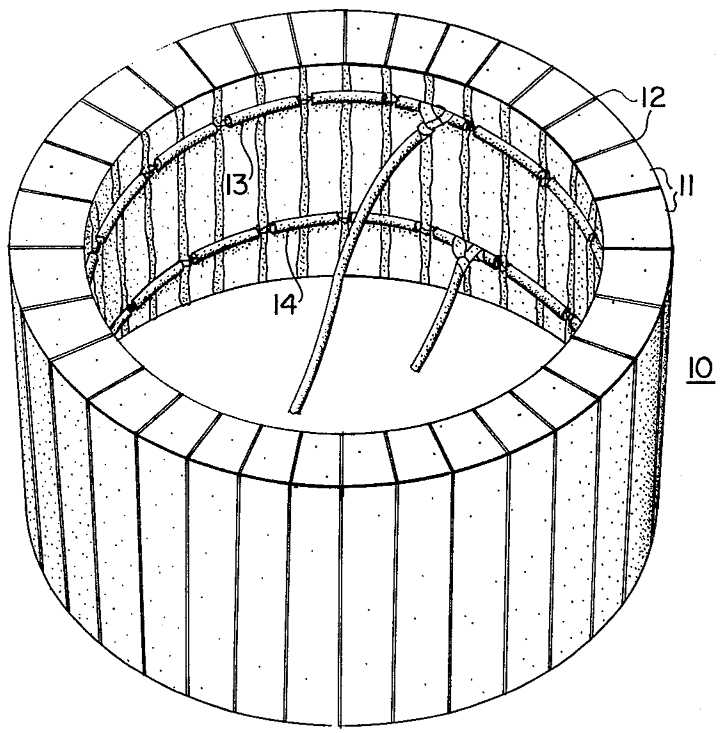
FIG. 1 is an elevational view of an assembled piezoelectric low frequency receiver before the addition of electrical insulation.

Now referring to the drawing there is shown by illustration in FIG. 1 a segmented ring hydrophone made of piezoelectric material, such as barium titanate, in accordance with the teaching of this invention. The segmented ring 10 is made by a plurality of like individual segments 11 secured together by use of suitable epoxy in face-to-face relationship with conducting electrodes in the joint to form a cylinder. Each segment 11 may be formed by an extrusion process, formed from a cylinder of piezoelectric material of the desired inner and outer diameter cut into a desired number of segments or in any other suitable manner. Thus, two directly opposite faces of a stave cut from a cylinder will be on a taper since the segment is cut along radii with the other two faces having the curvature of the inner and outer diametrical surfaces of the cylinder with the inner surface being smaller. As an example, the hydrophone shown in FIG. 1 is formed by 32 barium titanate segments with the assembled cylinder having an outside diameter of 8 ⅛ inches, an inside diameter of 6 15/16 inches, and a height of 4 3/4 inches. Each face-to-face joint includes an electrode 12 along the length thereof in which alternate electrodes are electrically connected in parallel to different electrical lines 13, 14 so that adjacent electrodes are oppositely charged. The electrical lines are connected with a suitable connector 15 and cable 16 as shown on FIG. 2 which conducts signals to an amplifier-receiver, not shown. The frequency of operation 200 Hz to 800 Hz is determined by the ring geometry and choice of material.

The material set forth above is barium titanate; however, other piezoelectric materials such as lead-zerconate-titanate, lead niobate, etc., may be used. Also, the staves may be rectangular with epoxy or epoxy and metal wedges filling the corners. The metal wedges could be the electrodes.

In order to join the separate segments or staves 11 together face-to-face, the adhesive used must be of good adhesive quality, with good electrical properties and not acoustically lossy.

Figure 2:
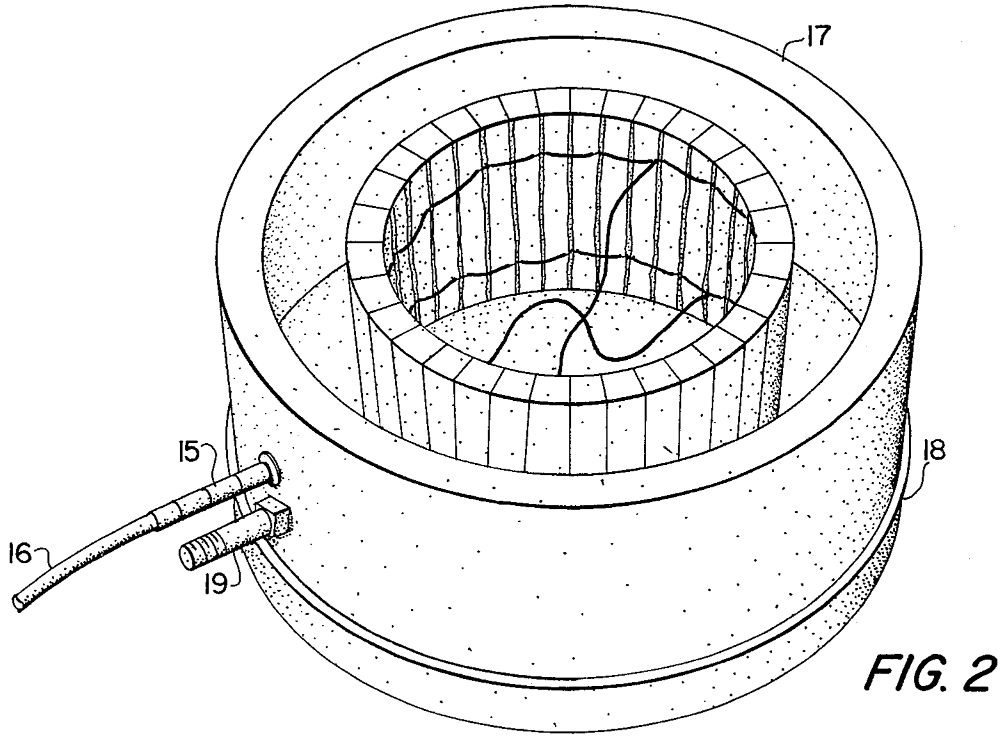
FIG. 2 illustrates the device of FIG. 1 in a rubber boot with one end removed to illustrate the relative parts.

FIG. 2 illustrates the assembled cylinder in a rubber boot 17. The rubber boot is provided with ends 18 which fit over the end of the boot and are secured thereto. The cylinder is secured at both ends of the boot in the center so there is a spacing between the outer surface of the cylinder and the inner surface of the boot. The electrical wires are brought out between the end of the cylinder and the end of the boot and connected electrically with the coupler connector 15. The boot is also provided with a valve 19 so that castor oil may be added to fill the interior voids of the boot.

The cylinder shown in FIG. 1 may also be used by coating the outer and inner surfaces of the cylinder with an electrically insulating material such as neoprene which is well known in the art. The hydrophone may be used at great depths and at a very low frequency with either method for electrical insulation.

Figure 3:
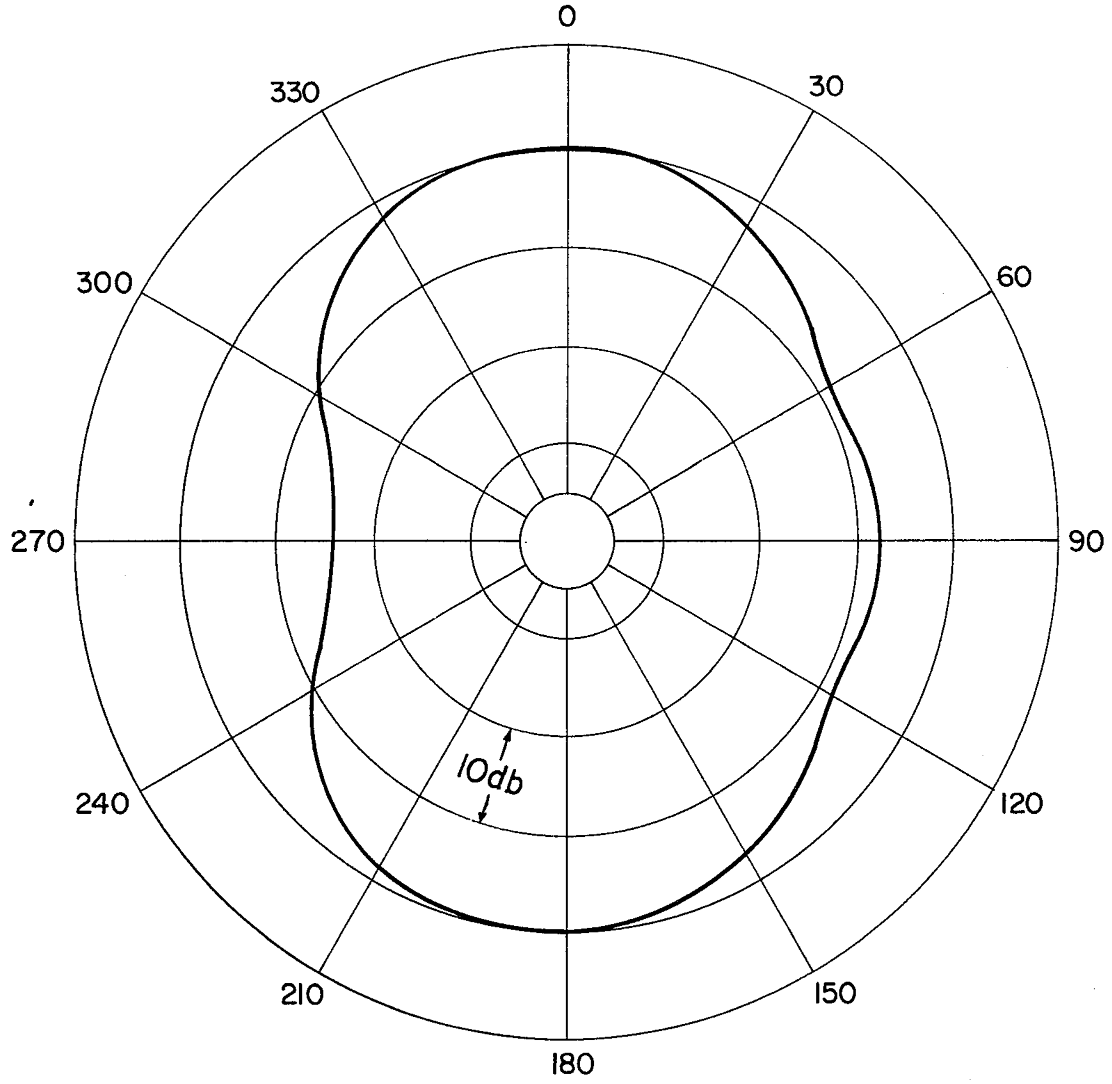
FIG. 3 illustrates an experimentally obtained directivity pattern at 474 Hz for the ring of FIG. 2.

The region of operation of the cylinder set forth above is from 200 Hz to 800 Hz. In this region, axial sensitivity of the hydrophone is relatively constant and the radial sensitivity is significantly reduced, that is, the hydrophone has an inverted pattern compared with the teachings of the state of the art. FIG. 3 illustrates a low frequency inverted pattern of a circumferentially polarized cylinder measured at a frequency of 474 Hz. This is the frequency for which the ratio of the axial response to the radial response is the greatest. The pattern is inverted because the monopole contribution cancels the higher order contributions in the radial direction. Since the monopole moment is small, this cancellation occurs at low frequencies where the contribution from the higher moments also becomes small. The relative signs of the volume velocity and the mean radial velocity are favorable for cancellation in the radial direction only for rings which are circumferentially polarized.

Figure 4:
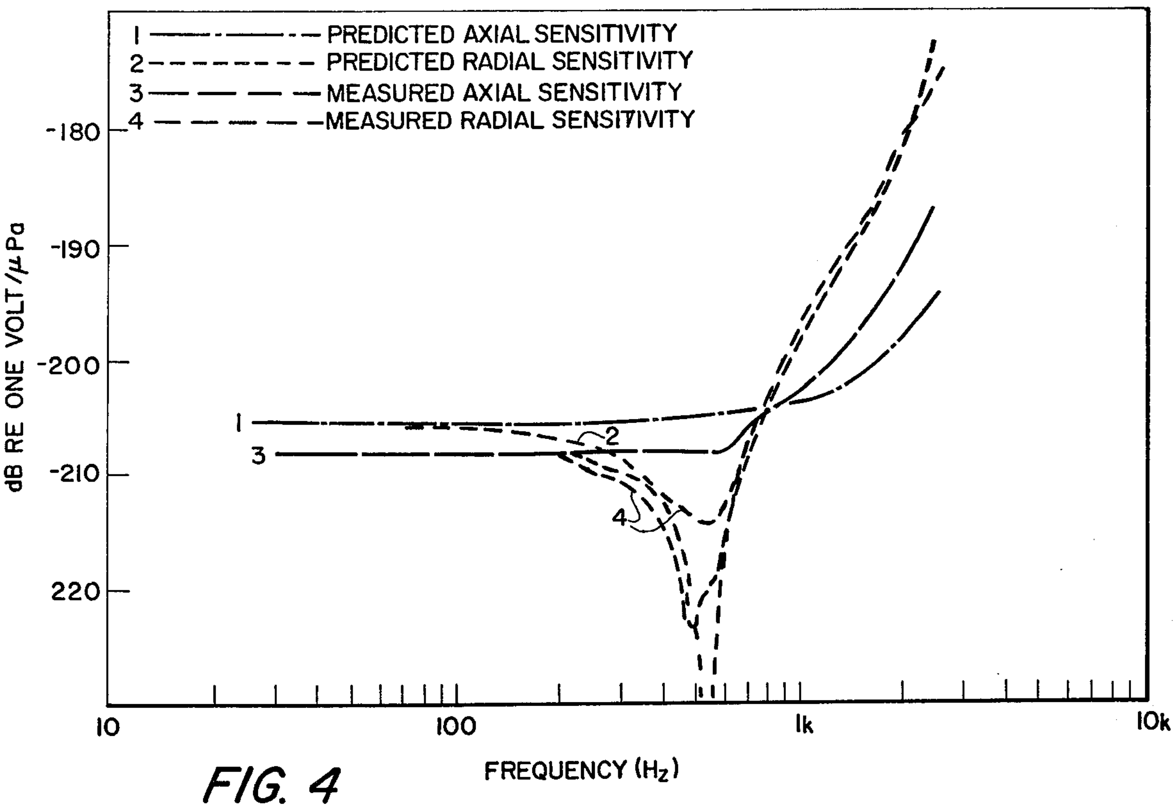
FIG. 4 illustrates the predicted and measured axial and radial receiving free-field voltage sensitivities for the circumferentially polarized hydrophones of FIG. 2.

FIG. 4 illustrates the predicted free-field voltage sensitivities and measured sensitivities of the circumferentially polarized cylinder. The axial responses are curves 1 and 3 and the radial responses are curves 2 and 4. It is seen that in the region of the inverted pattern, the axial sensitivity is relatively constant but the radial response is significantly reduced. The predicted sensitivities are completely determined by the ring geometry and the material constants.

Figure 5:
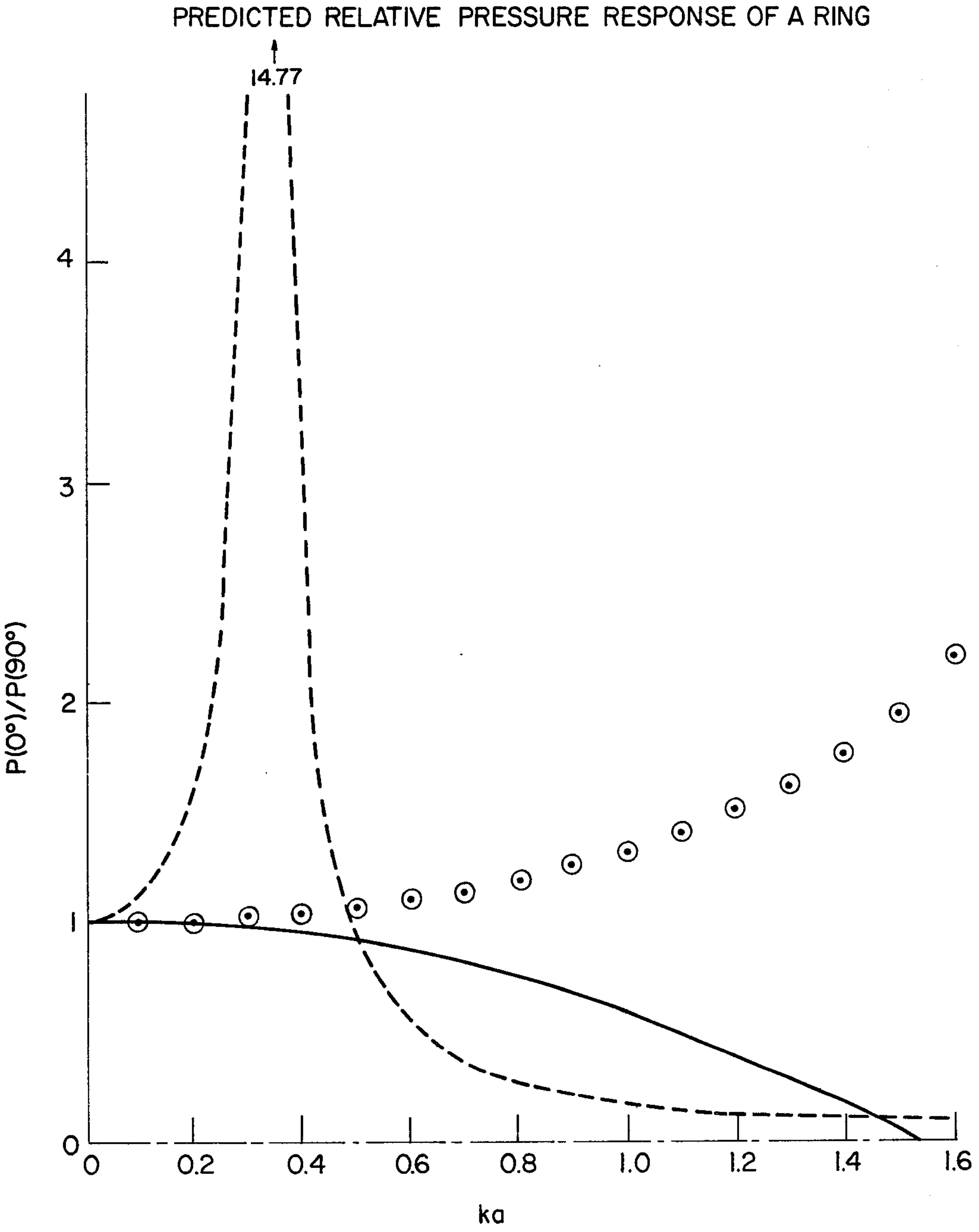
FIG. 5 illustrates the ratio of axial response to the radial response as a function of the dimensionless frequency, *ka*, compared with the responses of such a ring predicted by the state of the art teachings.

FIG. 5 illustrates the relative pressure response of a ring, i.e., the ratio of axial response to the radial response as a function of the dimensionless frequency ($ka$). The figure compares the predicted and experimentally verified curve produced by the device of this invention with curves predicted by the state of the art teaching for such a device. It is noted that the inventors' curve shows a sharp peak in the region $ka = 0.35$ whereas the other curves indicate no such behavior. In the formula $ka = 0.35$, $k$ equals wave number, which is $2\pi f/c$ where $f$ = frequency, $c$ = velocity of sound in the medium, and $a$ = mean radius of the cylinder or ring. The peak in the curve of the inventor's device is not normal behavior for cylinders or other small acoustic radiators. Furthermore, the phenomenon of pattern inversion is observed only for circumferentially polarized cylinders or rings. This phenomenon of pattern inversion at very low frequencies is the fundamental underlying principle of operation of subject invention. The phenomenon of pattern inversion occurs two or more octaves below the usual operating range of a circumferentially polarized ring. The monopole free-field voltage sensitivity for a circumferentially polarized free-flooded ring is given by $$\frac{V}{P} = \frac{1}{N} \frac{2\pi b}{\ln(\rho)} (1 - \rho)(g_{33} + 2g_{31}) \text{ where } \rho = a/b$$

In this expression; $a$, is the inside radius of the cylinder; $b$, is the outside radius of the cylinder; and $\rho$, is the ratio of the inside radius to the outside radius $\rho = a/b$. The $g$'s (piezoelectric constants) represent the fields produced per unit applied stress. The quantity $N$ is the number of segments in the segmented cylinder. The sensitivity $V/P$ is the ratio of the electrical voltage out ($V$) to the acoustic pressure in ($P$). For circumferential polarization, the free-field voltage sensitivity in the axial direction is relatively constant throughout the region of pattern inversion. Hence the axial sensitivity is approximately given by the above expression throughout the operating region of the transducer made in accordance with this invention.

Figure 6:
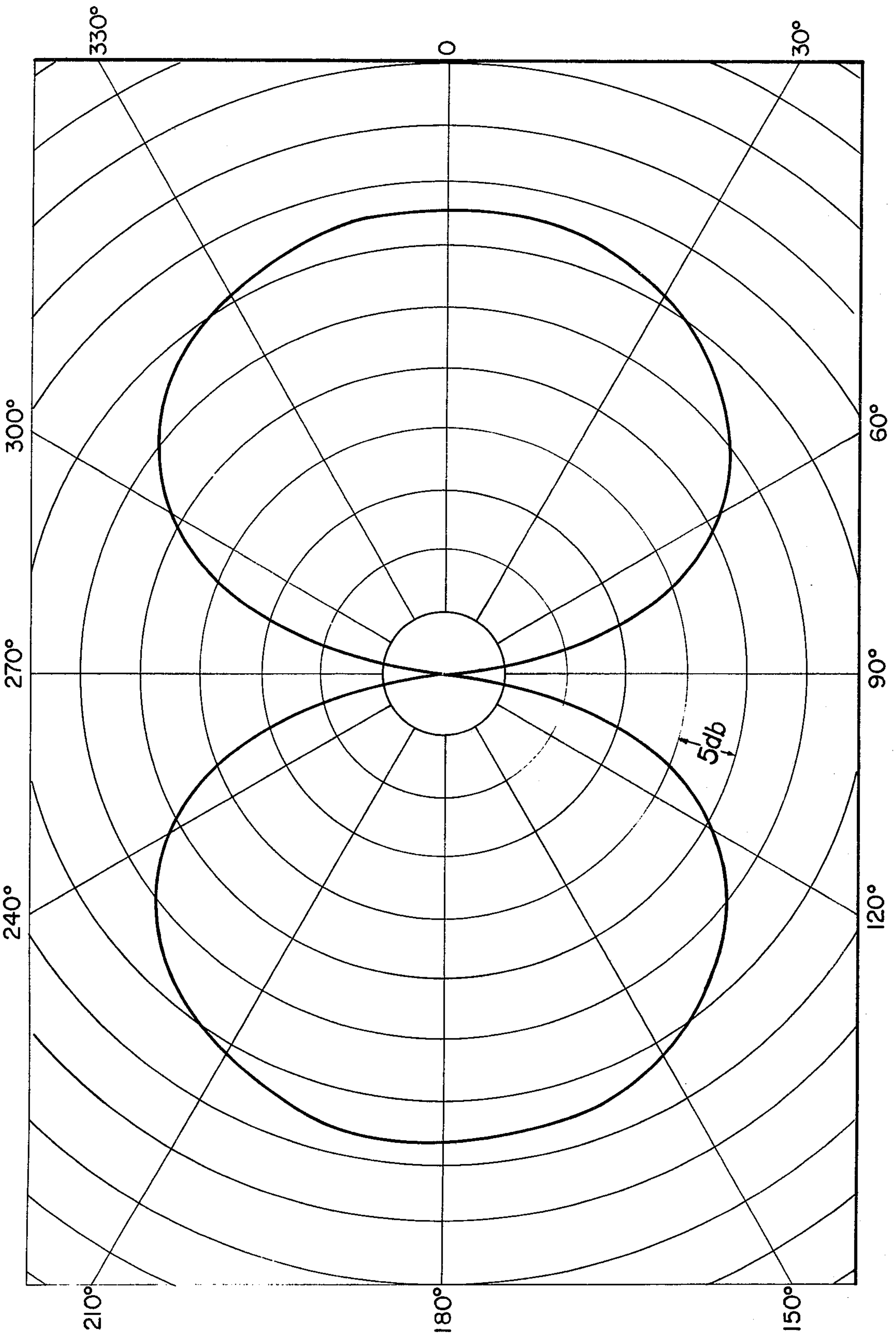
FIG. 6 illustrates the predicted directivity pattern at the frequency for which the radial sensitivity is a minimum.

FIG. 6 illustrates the predicted directivity pattern at the frequency for which the radial sensitivity is a minimum. The frequency at which this effect occurs can be controlled by proper choice of ring geometry and ring material.

Figure 7:
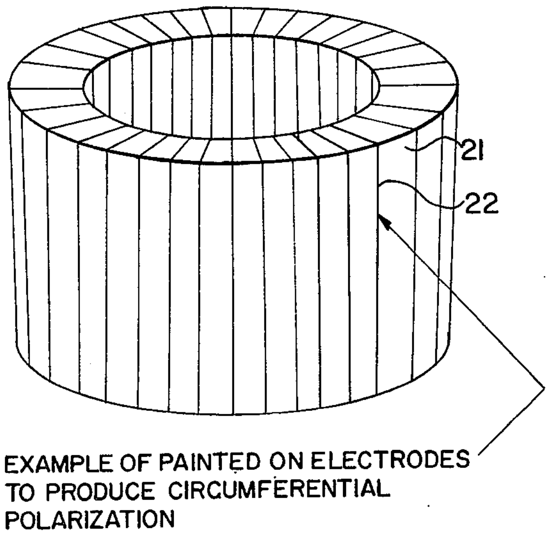
FIG. 7 illustrates a circumferentially polarized cylindrical ring type hydrophone with the electrodes painted on the outer surface thereof.

FIG. 7 illustrates a modification of the cylinder or ring as shown in FIGS. 1 and 2. The modification is a solid cylinder or ring 21 of piezoelectric material upon which has been painted conductive electrodes 22. The electrodes encircle the wall of the cylinder on equally spaced radii. Thus, the piezoelectric material between each painted electrode will be of equal segments of the circumference. Alternate electrodes are connected in parallel to a signal receiver in order to obtain a signal from an incident acoustical wave. These same electrodes are used to polarize the ring material. The cylinder is circumferentially polarized as set forth above for the hydrophone of FIGS. 1 and 2. Thus, alternate painted-on electrodes are connected in parallel electrically to a high voltage direct current power supply and heated in an oil bath for a period of time. The oil bath may be omitted but the time required for polarization is greater. Such method of polarization is well known in the art and described in a book, *Solid State Magnetic and Dielectric Devices*, pages 492–494, edited by H. W. Katz, John Wiley and Sons, Inc., copyright 1959.

The modification shown in FIG. 7 is operated in the same manner as the device shown in FIG. 1 and 2.

The hydrophone as set forth may be made of magnetostrictive materials and operated as is well known in the art.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. A method of low frequency operation of a small sized free-flooded circumferentially polarized ring-type hydrophone which comprises:

operating said hydrophone at an operating range which is more than two octaves below any of its axisymmetric, mechanical resonant frequency.

2. A method as claimed in claim 1, wherein:

the operating range of said hydrophone is from 0.192 *ka* to about 0.35 *ka*, where *k* is the wave number, $k = 2\pi f/c$; and $f$ is frequency, $c$ is the velocity of sound in the medium, and $a$ is the means radius of the cylinder of the ring.

3. A method as claimed in claim 1, wherein:

the frequency of operation is from about 200 to 800 Hz.

4. A cylindrical directional hydrophone operative over a frequency range of from 200 to 800Hz which comprises:

a plurality of identical linear segments of piezoelectric material assembled side-by-side in a cylindrical configuration; and an electrical conductor along the length of and in elecrtrical contact with adjacent faces of said linear segments with alternate conductors connected electrically in parallel, said hydrophone having a maximum height and radial dimension which is very small compared to its low frequency operational wavelength with an axial response which is larger than its radial response, and said hydrophone being acceleration insensitive and having an outside diameter of 8 ⅛inches, an inside diameter of 6 15/16 inches and a height of 4 ¾inches.

5. A cylindrical directional low frequency hydrophone as claimed in claim 4, wherein:

said hydrophone is made of 32 identical linear segments of barium titanate; and a receiver connected with said electrically connected conductors.

6. A directional, low frequency, 200Hz-to-about-800Hz hydrophone which comprises:

a cylindrical ring made of barium titanate having an outside diameter of 8 ⅛inches, an inside diameter of 6 15/16 inches and a height of 4 ¾inches;

a plurality of equally spaced electrodes painted around the length and thickness of said ring with each electrode aligned around said ring along different radii of said ring;

conductive means electrically connected in parallel to alternate electrodes; and an electrical signal reveiver connected to said conductive means.

* * * * *